US007155182B2

(12) United States Patent
Eckl et al.

(10) Patent No.: US 7,155,182 B2
(45) Date of Patent: Dec. 26, 2006

(54) VARACTOR WITH EXTENDED TUNING RANGE

(75) Inventors: Wolfgang Franz Eckl, Spardorf (DE); Georg Fischer, Nuremberg (DE); Gerhard Kaminski, Fuerth (DE)

(73) Assignee: Lucent Technologies Inc., Murray Hill, NJ (US)

( * ) Notice: Subject to any disclaimer, the term of this patent is extended or adjusted under 35 U.S.C. 154(b) by 389 days.

(21) Appl. No.: 10/601,815

(22) Filed: Jun. 23, 2003

(65) Prior Publication Data

US 2004/0147237 A1 Jul. 29, 2004

(30) Foreign Application Priority Data

Jul. 16, 2002 (EP) ................... 02254974

(51) Int. Cl.
*H04B 1/18* (2006.01)
(52) U.S. Cl. ................ 455/180.4; 331/177 V; 455/180.2
(58) Field of Classification Search ........ 455/318, 455/319, 320, 275, 193.1, 191.2, 192.1, 192.2, 455/180.4, 180.2; 331/177, 179, 177 V
See application file for complete search history.

(56) References Cited

U.S. PATENT DOCUMENTS 5,880,921 A * 3/1999 Tham et al. ................ 361/233
6,232,847 B1 5/2001 Marcy, 5th et al. ......... 331/167
6,310,419 B1 10/2001 Wood .......................... 310/306
6,507,475 B1 * 1/2003 Sun ............................. 361/281
6,593,672 B1 * 7/2003 Ma et al. .................... 307/109
6,856,206 B1 * 2/2005 Perrott ........................ 331/25
2002/0040991 A1 * 4/2002 Embabi et al. ............. 257/312
2002/0168038 A1 * 11/2002 Damgaard et al. ......... 375/344
2003/0132820 A1 * 7/2003 Shamsaifar et al. ........ 333/205
2003/0146464 A1 * 8/2003 Prophet ...................... 257/306
2004/0041671 A1 * 3/2004 Van Rumpt ................. 334/30

FOREIGN PATENT DOCUMENTS

| DE | 199 14 698 A1 | 10/1999 |
| DE | 100 53 216 A1 | 5/2002 |
| WO | WO 01/31774 A1 | 5/2001 |

* cited by examiner

*Primary Examiner*—Quochien B. Vuong
*Assistant Examiner*—Christian A. Hannon

(57) ABSTRACT

The invention proposes a device for high-frequency and/or radio-frequency tuning comprising within one IC-package a first variable capacitor ($C_1$) and at least one second capacitor ($C_2$), each of the at least one second capacitor ($C_2$) being fixed or variable respectively, at least one signal path connected to the first variable capacitor ($C_1$) and providing at least one input and one output port (rf-port1, rf-port2) and at least one controllable switching means ($S_{C2}$) for individually connecting and disconnecting at least one of the at least one second capacitor ($C_2$) into the signal path or from the signal path, in particular in parallel to the first variable capacitor ($C_1$).

10 Claims, 2 Drawing Sheets

VARACTOR WITH EXTENDED TUNING RANGE

CROSS REFERENCE TO RELATED APPLICATION

This application claims priority of European Application No. 02254974.5 filed on Jul. 16, 2002.

TECHNICAL FIELD

The present invention relates to a device for high frequency and/or radio frequency tuning.

BACKGROUND OF THE INVENTION

In particular with regard to mobile communication systems and/or networks, such as based on a GSM (Global System for Mobile communications), UMTS (Universal Mobile Telecommunication Systems), WCDMA (Wideband Code Division Multiple Access) and/or CDMA 2000 standard there is the tendency, that more and more frequency bands are opened up and/or being licensed resulting in a permanently increasing need to design corresponding radios.

However, classically, for every new frequency band an individual radio has to be designed that forces a complex infrastructure and terminal vendors have to develop a great variety of products, in particular in terms of base stations and/or user terminals, such as handsets adapted to be used within those communication systems.

Thus, especially regarding radio platforms of the 3G+ generation (3G+) of mobile communication systems, there is an objective to design radios, which work in several communication bands and hence, to establish for instance, multiband and/or multistandard mobile communication systems.

As a consequence, there is a significant need for oscillators, which can be tuned across a wide frequency range, wherein the requirement for a wide frequency range directly maps into a wide range for the tuning capacity in the oscillator.

Until today, so-called "varicap diodes" commonly are used for covering a certain tuning range. However, such varicap diodes are limited in terms of their variable capacity, which is rationed from the lowest to the highest value. Based on the drawback of the limited tuning range for the capacity, typically, several individual oscillators are implemented to respectively cover one sub-band by one oscillator, as indicated by the appended FIG. 3. However, an implementation of several oscillators is very cost consuming and additionally results in unwanted complexity and board space to a radio design.

Moreover such varicap diodes do not offer isolation between the signal path and the control path causing additional unwanted noise. Consequently, since the varicap diode merely has two connectors, typically a Bias-T is needed to isolate the control voltage from the oscillator signal. However, one of the most shortcomings based on such a Bias-T is, that the Q-factor of the resonator is degraded, since additional parasitic effects are introduced, in particular due to the additional Bias-T incorporated thereby raising noise of the oscillator.

Furthermore, the Bias-T adds some unwanted parasitics to the resonance circuitry and changes the frequency versus tuning-voltage slope of the oscillator.

Moreover, the capacitance of a varicap diode is determined by the width of the depletion area. Below the reverse breakdown voltage, this depletion area is not completely free of charges and charge fluctuations. This causes additional noise and limits the Q-factor.

An object of the invention is therefore to provide, in particular with regard to the above discussed state of the art, a new and improved approach for enabling an increased high-frequency and/or radio-frequency tuning range by a reduced complexity and board space even with regard to multiband and/or multistandard purposes, in particular suitable within the radio design for mobile communication systems and/or networks, advantageously by simultaneously reducing the undesirable parasitic influences.

Advantageous embodiments or refinements are the subject matter of the respective dependent claims.

Accordingly, the invention proposes a device for high-frequency and/or radio-frequency tuning comprising within one IC-package a first variable capacitor and at least one second capacitor, at least one signal path connected to the first variable capacitor and providing at least one input and one output port and at least one controllable switching means for individually connecting and disconnecting at least one of the at least one second capacitor into the signal path or from the signal path.

Each of the at least one second capacitors may be designed as being a fixed or a variable capacitor, respectively, based on respective specific intended applications.

One of the main advantages achieved thereby is, that due to the splitting of an intended variable capacitance which usually has to cover a wide tuning range into a first variable capacitor or varactor, which may have a small tuning range, and at least one second capacitor, which can be individually connected and disconnected into the signal path or from the signal path by switching means, advantageously in parallel to the first variable capacitor, the provided inventive device enables a significantly enhanced tuning range for the entire capacity and hence, an increased ratio between the lowest and the highest capacity value can be achieved.

In addition, due to the integration of all these components into one IC-package the dimensions are extremely small with regard to the high frequencies to be tuned and/or matched and hence high frequency signal based parasitic effects caused by large transmission lines going on- and off-chip with individual components are significantly reduced.

Furthermore, due to the integration of the realized inventive varactor with extended tuning range into one IC-package, there is only a very low amount of board space necessary to cover a variety of tuning and matching tasks.

Moreover, even with regard to multiband and/or multistandard purposes the invention provides a cost saving and board space saving solution, since the implementation of several individual tuning devices which would have to be switched at their respective output for respectively covering one sub-band is avoided.

Additionally, by the incorporation of the inventive tuning device into an rf-system, sensitive rf-parameters may easily be tuned for optimization purposes, instead of individually designing and optimizing a plurality of matching circuits. This enables, in particular with regard to the manufacture, a significant reduction of development costs and the possibility of compensating tolerances. Moreover, the redesign of critical circuits, for example due to a replacement of certain components usually resulting in time and cost consuming modifications of the circuitry layout, can often be avoided.

By using controllable switching means with an actuator and a contact element to close or open the switching means for the individually connecting and disconnecting and advantageously by using for a variable capacitor an actuator for driving a movable element of the variable capacitor to vary the effective area thereof, in particular by changing the distance between at least two plates or the degree of engagement of fingers of a comblike structure, it can be easily ensured, that the at least one control signal path for controlling the switching means and/or for tuning the variable capacitor can be isolated from the high frequency signal path.

According to advantageous embodiments, the at least one control path comprises means for digitally controlling a plurality of switching means individually and/or the at least one control path, in particular for controlling the switching means is connectable to an EPROM or EEPROM, to a FPGA (Field Programmable Gate Array) and/or to an ASIC (Application Specific Integrated Circuit), so that application specific and/or desired operating conditions of the inventive device can be set and/or retrievable stored.

Furthermore, the tuning or control path for controlling a tunable capacitor is practically adapted to be controllable via an analogue voltage or via a digital to analogue converter.

For the praxis, it is suggested, to provide a separate control path for a tunable device and/or at least one control bus for controlling a plurality of fixed capacitors by means of the respective associated switches.

To further increase the overall capacity tuning range, it is proposed to arrange at least two second capacitors, such as fixed capacitors for example, in logarithmic scale, wherein the variable first capacitor at least is adapted to match the lowest range of the logarithmic scale, thereby simultaneously providing the possibility to reduce the individual scale spacing steps there between.

According to an advantageous refinement, in particular for simplifying the integration within one IC-package it is proposed to fabricate the inventive device by using a so-called Micro-Electro-Mechanical-Systems (MEMS) technology.

By using such MEMS technology all internal parasitics are well defined and in comparison with the state of the art a production spread usually is avoided. The invention proposes further to produce the tunable components and/or the switches as three-dimensional mechanical structures, in particular by employing a bulk micro machining and/or a surface micro machining technology.

Based thereon, a controllable switching means is advantageously realized by using a MEMS switch. Correspondingly, the at least one tunable or variable capacitor incorporated within the inventive device is based on a MEMS-Varactor.

However even the incorporation of a switching means and a respectively associated second variable capacitor into one common MEMS-component is proposed, such as for example by designing a rocker means having a linear rock range for providing the variability and a non-linear rock range for providing a switch-off function. Based thereon, the resistance of a separate switch means is additionally avoided.

According to advantageous embodiments the actuating mechanisms means respectively comprises a mechanism based on electrostatic, piezoelectric, thermal, magnetic or bimetallic actuator functionality.

A further advantage of providing the inventive device, as a MEMS-based device is, that the technology for the varactor and the switching means is of the same type. Moreover, even such a MEMS-based device provides the possibility for an easy combination with further circuits, especially application specific circuits, based on Silicon, CMOS and/or BICMOS (Bipolar-CMOS) technology for example, especially allowing the integration of some control logic for a digital port or an active rf-signal circuit.

As a consequence, by advantageously using the technique of Micro-Electro-Mechanical-Systems (MEMS) for the integration of capacitors, varactors and high frequency-switches into one IC-package, a versatile electrical device for tuning a wide high-frequency range and even for matching purposes is provided, with the advantages of a low noise of the tunable capacitor of a very high isolation between the controlling paths and high-frequency paths. Hence, low tolerance components with well defined internal parasitics are achieved, wherein the complete inventive configuration can be utilized for covering reconfiguration, optimization or tuning purposes within a wide capacity and/or frequency range and hence can be used in several application areas. Such an advantageous application areas are especially the use within a communication system and/or network, in particular a mobile communication system and/or network based on a GSM, UMTS, WCDMA and/or CDMA 2000 standard, within an oscillator, in particular adapted for use within a receive and/or transmit radio unit of a mobile communication system, within a base station or within a user terminal in particular adapted for use within a mobile communication system.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

Figure 1:
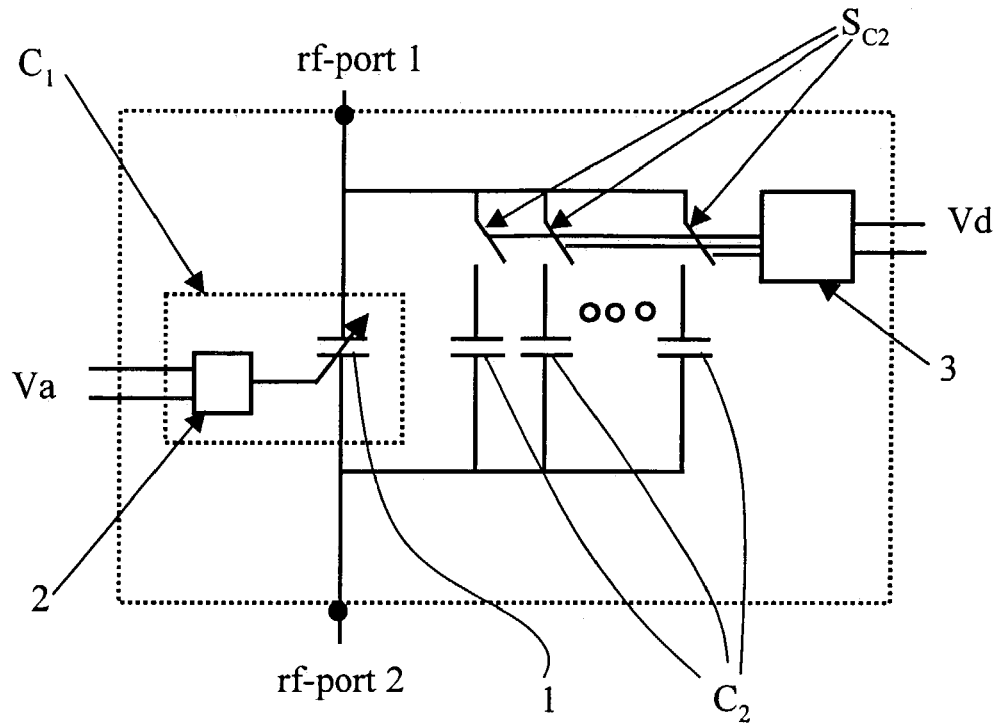
FIG. 1 is schematically depicting an inventive embodiment of an inventive varactor with extended tuning range.
Figure 2:
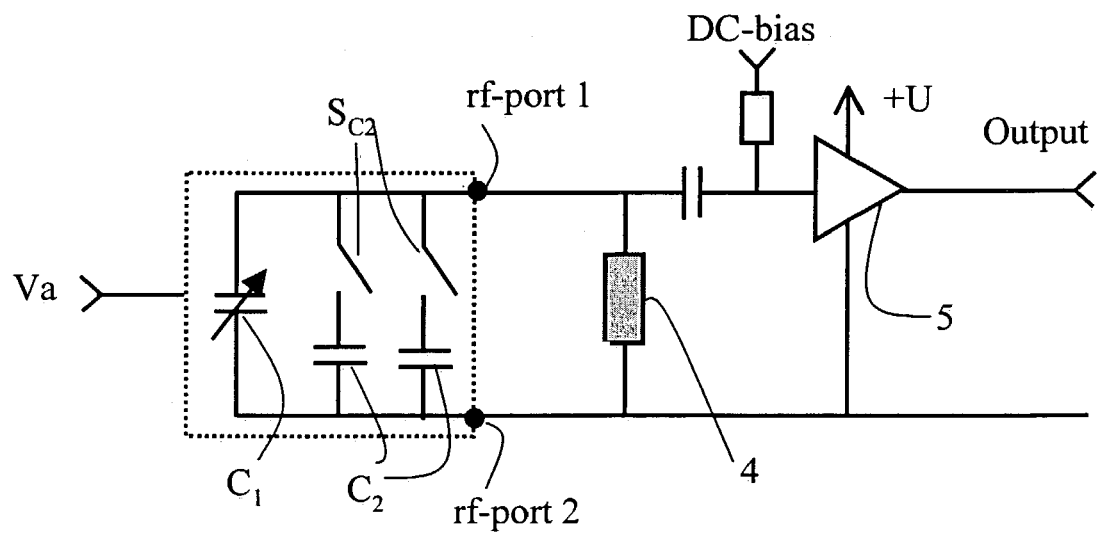
FIG. 2 is schematically depicting an inventive application of an oscillator with extended frequency range based on the embodiment of FIG. 1 and with an amplifier providing the negative resistance.

Regarding FIG. 1, an advantageous but exemplar embodiment of the tuning device according to the invention incorporates the integration of three high-frequency switches $S_{C_2}$, of three fixed capacitors $C_2$, one tunable capacitor called varactor $C_1$ into one IC-device or package fabricated on the basis of the so called MEMS (Micro-Electro-Mechanical-Systems) technology. As can be seen from FIG. 1 the exemplar inventive tuning device incorporates a signal path provided with two signal ports rf-port1 and rf-port2 each of which advantageously at an outer IC-package surface for the interconnecting with a further component, such as an inductor or resonator 4 of an oscillator, as depicted in FIG. 2, or a matching circuit and individually usable as an input or an output for the signal path, respectively. According to FIG. 2, then an amplifier 5 may provide the negative resistance of the oscillator and a DC-bias fed from the outside of the amplifier 5, as depicted in FIG. 2, may be integrated alternatively in the amplifier 5.

Each of the switches $S_{C2}$ is controllable based on an actuator part causing a contact part of the switch to close or open the switch, and the variable capacitor $C_1$ comprises an actuator 2 for driving a movable element of the variable capacitor $C_1$ to vary the effective area 1 thereof, wherein the drive of the actuator part 2 is de-coupled from the signal path, as described below.

The fixed capacitors $C_2$ are arranged such, that each thereof can be selectively connected within the signal path between the signal ports rf-port1 and rf-port2 in a parallel manner with regard to the tunable capacitor $C_1$ by means of the respective associated switch $S_{C2}$.

It is mentioned, that each capacitor $C_2$ provided for the selective connection within the signal path and designed according to FIG. 1 as being fixed, may also be designed as a variable capacitor, respectively. Thus, the number of three switchable fixed capacitors $C_2$ of FIG. 1 is just an example.

With the internal structure of the inventive tuning device it is possible to realize a tunable varactor with a very extended tuning range.

For example, by arranging the respective fixed capacity values in a logarithmic scale, such as 0.5 pF, 1 pF, 2 pF, 4 pF, 8 pF and so on, wherein the variable capacitor $C_1$ practically matches at least the lowest range, such as for tuning from 0.5 pF to 1 pF, resulting capacity values in the range from 0.5 pF to 9 pF can be realized. Accordingly, the capacity ratio from originally 1:2, based on the variable capacitor $C_1$, has been increased to 1:20.

In this regard it is noted, that a frequency ratio, for example within a advantageous inventive application of an oscillator with extended frequency range as depicted in FIG. 2, equals only the square root of the capacity ratio. Thus, a frequency ratio of originally 1:1.4 then is increased to a ratio of 1:4.5, based on the afore-mentioned example. A ratio of 1:4, however, can be considered as a significant improvement and hence, suitable for 3G+ applications of mobile communication systems.

Figure 3:
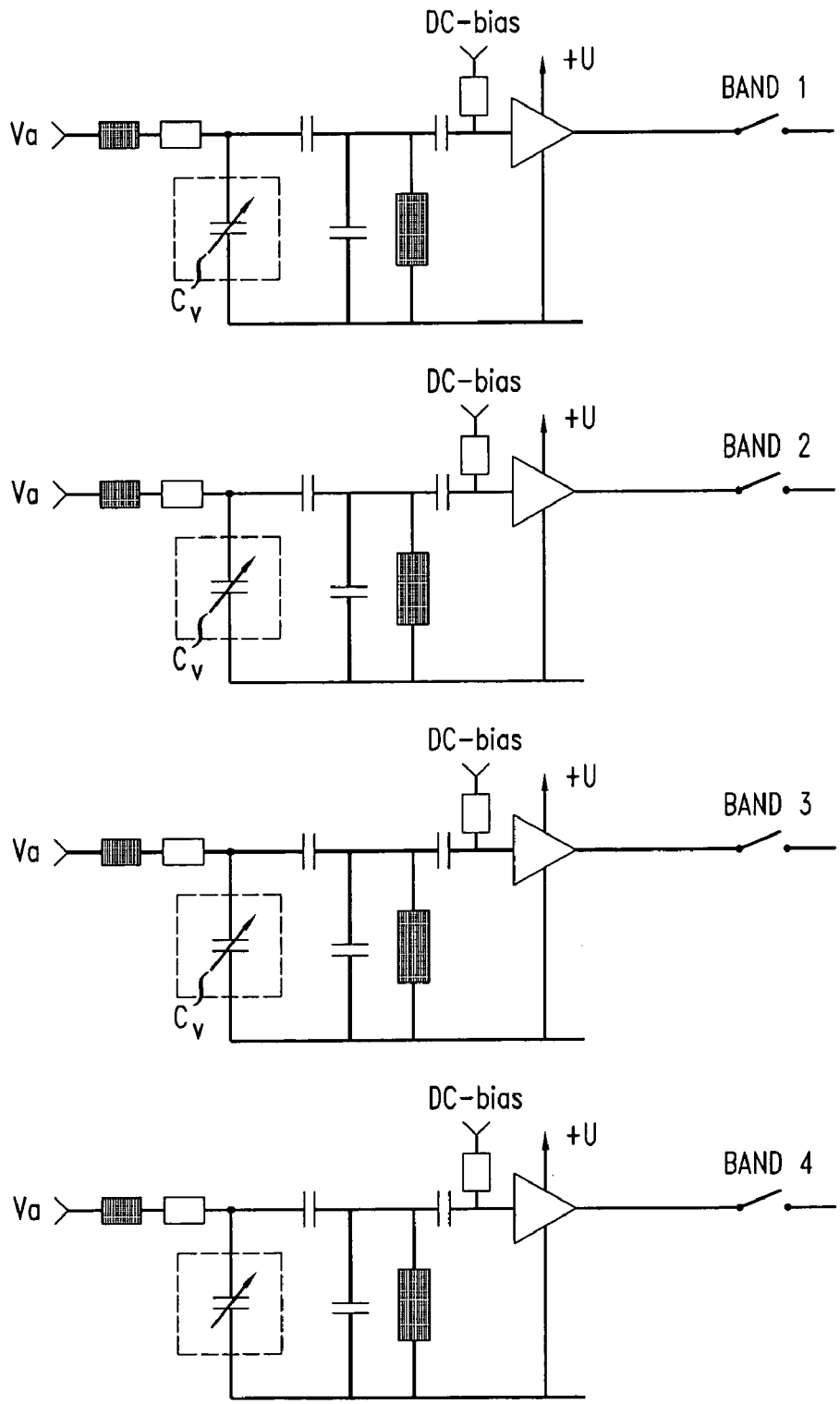
FIG. 3 is schematically depicting a classical architecture for an oscillator with wide frequency range.

Accordingly, by incorporating the inventive varactor with an extended tuning range into an oscillator for example, as depicted in FIG. 2, the implementation of several oscillators, each of which merely having one varicap diode or one varactor $C_V$, as depicted in FIG. 3, and which have to be switched at their outputs to respectively covering one frequency sub-band Band 1, Band 2, Band 3 or Band 4 can be avoided.

Even with regard to the manufacture, inventive tuning devices may be incorporated into a rf-system, such as a communication system and/or network, a base station, a user terminal, in particular adapted for use within a receive and/or transmit radio unit of a mobile communication system, to easily tune sensitive rf-parameters for optimization purposes, instead of individually designing and optimizing a plurality of matching circuits of the rf-system.

Furthermore, as can be seen from FIG. 1 the switches $S_{C2}$ responsible for connecting or disconnecting the respective fixed capacitors $C_2$ into the signal path or from the signal path are advantageously controlled via a digital control signal $V_d$.

Thus, the control bus can be connected to an EPROM or even an EEPROM for retrievable storing different operating conditions. Hence if for example an application specific operating condition is desired the correspondingly stored condition can be activated in a simple manner by use of such (E) EPROM.

Moreover the bus may be connected to a logic switch control 3 having a digital port for receiving the digital signal $V_d$.

This can be easily realized by the advantageously MEMS-based device, since the possibility of an easy combination with further circuits, especially application specific circuits, based on Silicon, CMOS and/or BICMOS (Bipolar-CMOS) technology for example, especially allowing the integration of some control logic for a digital port or an active rf-signal circuit.

Furthermore the tunable capacitor $C_1$ practically is connected to a separate tuning port, which can be controlled, especially via an analogue voltage $V_a$ or via a digital to analogue converter.

As mentioned above, the entire IC-package or device is advantageously produced by providing 3-dimensional mechanical structures for example based on a bulk micromachining technology and/or a surface micromachining technology.

In particular, in bulk micromachining these structures, especially the tunable component $C_1$ and the switches $S_{C2}$ may be sculpted within the confines of a wafer by exploiting the anisotropic edging rates of different atomic crystallographic plans in the wafer. On the other hand side, the structures may be formed by the process of fusion bonding, which entails building up a structure by atomically bonding various wafers.

According to the surface micromachining based MEMS technology the 3-dimensional mechanical structures may be built up by the orchestrated addition and removal of a sequence of thin film layers to or from a wafer surface.

As a further alternative the mechanical structures may be fabricated by using thick photoresists, which are exposed to X-rays to produce molds that are subsequently used to form high-aspect ratio electroplated 3-dimensional structures.

In this regard, i.e. based on a Micro-Electro-Mechanical-Systems-technology, the switches $S_{C2}$ and the varactor $C_1$ can be designed with a very low insertion loss, a high linearity and a high isolation, in particular with regard to the control signal transmitted by the bus to the switch actuators, that is essentially absolutely de-coupled or isolated from the switch contacts and hence, from the high-frequency or radio-frequency signal path.

The actuators of the switches $S_{C2}$ and of the tunable varactors, i.e. according to FIG. 1 or 2 of the varactor $C_1$, may be based on a plurality of structures including a cantilever, a membrane, a shape-memory alloy and/or a multi-pole/multi-throw.

As an advantageous actuation mechanism an electrostatic mechanism is used, i.e. a positive and/or negative charge applied between certain structural members of the MEMS components elicit coulomb forces, which produce motion.

With regard to the switches $S_{C2}$ for example, by a control voltage activated by the switch control 3 in response to the digital signal $V_d$.

As an alternative, the actuation mechanism may be based on a piezoelectric effect, i.e. the control voltage is applied on a certain structure of a respective MEMS component for inducing a field, which changes the physical dimensions of the structure to communicate motion. As further exemplar alternatives, a control current can be forced through a certain element of a respective MEMS component causing it to heat up and expend with the physical dimensional change used to communicate motion or a control signal can induce a magnetic force producing motion.

Hence, a number of actuation mechanisms may be used for high frequency MEMS device applications. However, an electrostatic based actuation is one of the most advantageous actuation mechanisms and surface micromachining, which is advantageously used for producing electrostatically-based actuators, is compatible with integrated circuit fabrication processes.

Furthermore, the MEMS components can be used with resistive or metal-to-metal contact areas and/or with capacitively-coupled switching areas in which the contact is made via an insulating dielectric layer.

The effective area 1 of the tunable capacitors $C_1$ can be based for example on at least two spaced plates or on a comblike structure, wherein the tuning of the capacitor $C_1$ or varactor then can be based for example, on a variation of the effective area 1 of the capacitor by changing the distance between the plates or the degree of engagement of fingers of the comblike structure, controlled by the tuning voltage $V_a$.

Moreover, even the incorporation of a switching means $S_{C2}$ and a respectively associated second variable capacitor into one common MEMS-component is possible, such as for example by designing a rocker means having a linear rock range for providing the variability and a non-linear rock range for providing a switch-off function.

Based on the advantageous embodiments using the MEMS technology, the varactor tuning voltage $V_a$ is isolated from the high frequency-signal path, since the MEMS-varactor $C_1$ offers two connectors for the variable capacitance element 1 and two connectors for the tuning voltage $V_a$. Hence, in particular the tunable capacitor $C_1$ has a very low noise by using the MEMS technology, wherein the mechanical stiffness additionally serves as low pass filter on control signals.

Thus, by using the MEMS-technology, substantially all internal parasitics of the MEMS structures are well defined without no production spread in substantial, so that low tolerance components are achieved such that the complete configuration is universal in terms of reconfiguration and optimization and can be used in re-configurable and/or tunable systems and/or in several areas of a receive/transmit chain, in particular within applications where the re-configuration and/or tuning requirements are not critical with regard to time, since the mechanical structures or components may introduce a kind of mechanical inertia.

It is mentioned, that even the invention is described with regard to the appended figures, the invention also comprises embodiments incorporating a different number of components, since the structure of the inventive device can also be scaled in terms of more fixed and variable components.

The invention claimed is:

1. A device for high-frequency and/or radio-frequency tuning comprising a single IC-package having an rf input port and an rf output port with a signal path therebetween, said package containing:
   a first variable capacitor connected in the signal path between the input and output ports, having its first electrode connected to the input port and its second electrode connected to the output port, the first variable capacitor being controllable via a control path isolated from the signal path;
   a plurality of second fixed capacitors; and
   a plurality of digitally controllable switching means for individually connecting and disconnecting said second fixed capacitors into or from the signal path, in parallel to and across the first variable capacitor, the second fixed capacitors being arranged in a logarithmic scale, and the first variable capacitor matching the lowest range of the logarithmic scale; and
   the first and second capacitors and switching means being fabricated as a single integrated MEMS technology arrangement.

2. The device of claim 1, wherein the switching means comprises a mechanical actuator for driving a contact element of the switching means to close or open the switching means.

3. The device of claim 1, wherein the switching means and at least the first variable capacitor respectively comprises a mechanical actuating mechanism based on at least one of an electrostatic, piezoelectric, thermal, magnetic and bi-metallic actuator functionality.

4. The device of claim 1, wherein the plurality of digitally controllable switching means is connectable to one at least of an (E)EPROM, an ASIC and a FPGA.

5. The device of claim 1, wherein the control path is adapted to control the first variable capacitor via an analogue control signal.

6. The device of claim 5, wherein the analogue control signal is derived from a digital to analogue converter.

7. The device of claim 1, wherein the first variable capacitor comprises an actuator for driving a movable element of said variable capacitor to vary the effective area thereof.

8. The device of claim 7, wherein the first variable capacitor comprises an actuator for driving a movable element of said variable capacitor to vary the effective area thereof by changing the distance between at least two plates.

9. The device of claim 7, wherein the first variable capacitor comprises an actuator for driving a movable element of said variable capacitor to vary the effective area thereof by the degree of engagement of fingers of a comblike structure.

10. The device of claim 1, wherein the capacitance of the variable capacitor is controlled using an analogue control signal and the switching means are controlled using a digital control signal.

* * * * *